(12) United States Patent
Finkel et al.

(10) Patent No.: US 10,877,110 B2
(45) Date of Patent: Dec. 29, 2020

(54) ULTRA-LOW POWER MAGNETOELECTRIC MAGNETIC FIELD SENSOR

(71) Applicants: 06;The Government of the United States of America, as represented by the Secretary of the Navy, Arlington, VA (US); 02;Carnegie Mellon University, Pittsburgh, PA (US)

(72) Inventors: Peter Finkel, Baltimore, MD (US); Steven P. Bennett, Alexandria, VA (US); Margo Staruch, Alexandria, VA (US); Konrad Bussmann, Alexandria, VA (US); Jeffrey W. Baldwin, Fairfax, VA (US); Bernard R. Matis, Alexandria, VA (US); Ronald Lacomb, West Greenwich, RI (US); William Zappone, West Greenwich, RI (US); Julie Lacomb, West Greenwich, RI (US); Meredith Metzler, Havertown, PA (US); Norman Gottron, Pittsburgh, PA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 102 days.

(21) Appl. No.: 15/919,529

(22) Filed: Mar. 13, 2018

(65) Prior Publication Data

US 2018/0259599 A1  Sep. 13, 2018

Related U.S. Application Data

(60) Provisional application No. 62/470,489, filed on Mar. 13, 2017.

(51) Int. Cl.
*G01R 33/09* (2006.01)
*H01L 43/08* (2006.01)
(Continued)

(52) U.S. Cl.
CPC ............ *G01R 33/093* (2013.01); *B82Y 25/00* (2013.01); *H01L 41/1132* (2013.01);
(Continued)

(58) Field of Classification Search
None
See application file for complete search history.

(56) References Cited

U.S. PATENT DOCUMENTS

2013/0105921 A1* 5/2013 Najafi ................. G01C 19/574
257/415
2013/2389913     10/2013 Jahns et al.
(Continued)

OTHER PUBLICATIONS

Wang et al., "An Extremely Low Equivalent Magnetic Noise Magnetoelectric Sensor," Adv. Mater., 23, 4111 (2011).
(Continued)

*Primary Examiner* — Paresh Patel
(74) *Attorney, Agent, or Firm* — US Naval Research Laboratory; Rebecca Forman

(57) ABSTRACT

A high-sensitivity and ultra-low power consumption magnetic sensor using a magnetoelectric (ME) composite comprising of magnetostrictive and piezoelectric layers. This sensor exploits the magnetically driven resonance shift of a free-standing magnetoelectric micro-beam resonator. Also disclosed is the related method for making the magnetic sensor.

13 Claims, 3 Drawing Sheets

(51) Int. Cl.
  *B82Y 25/00* (2011.01)
  *H01L 41/113* (2006.01)
  *H01L 41/47* (2013.01)
  *H01L 43/12* (2006.01)
  *H01L 41/29* (2013.01)

(52) U.S. Cl.
  CPC .............. *H01L 41/29* (2013.01); *H01L 41/47* (2013.01); *H01L 43/08* (2013.01); *H01L 43/12* (2013.01)

(56) References Cited

U.S. PATENT DOCUMENTS

| | | | |
|---|---|---|---|
| 2014/0192836 A1* | 7/2014 | Neilson | G01N 29/022 374/28 |
| 2016/0003924 A1 | 1/2016 | Rinaldi et al. | |
| 2016/0289063 A1* | 10/2016 | Ocak | H01L 25/00 |
| 2018/0054176 A1* | 2/2018 | Kim | H01L 41/0477 |
| 2019/0086487 A1* | 3/2019 | Jamali | G01N 24/08 |

OTHER PUBLICATIONS

Nan et al, "Self-Biased 215MHz Magnetoelectric NEMS Resonator for Ultra-Sensitive DC Magnetic Field Detection," Sci. Rep., 3, 1985 (2013).

Finkel et al., "Enhanced resonant magnetoelectric coupling in frequency-tunable composite multiferroic bimorph structures," Appl. Phys. Lett., 98, 092905 (2011).

Gojdka et al., "Fully integrable magnetic field sensor based on delta-E effect," Appl. Phys. Lett., 99, 223502 (2011).

Kiser et al, "Magnetostrictive stress reconfigurable thin film resonators for near direct current magnetoelectric sensors," Appl. Phys. Lett., 104, 7, 072408 (2014).

Staruch et al., "Effects of magnetic field and pressure in magnetoelastic stress reconfigurable thin film resonators," Appl. Phys. Lett., 107, 3, 032909 (2015).

* cited by examiner

ULTRA-LOW POWER MAGNETOELECTRIC MAGNETIC FIELD SENSOR

PRIORITY CLAIM

The present application is a non-provisional application claiming the benefit of U.S. Provisional Application No. 62/470,489 filed on Mar. 13, 2017 by Peter Finkel et al., entitled "ULTRA-LOW POWER MAGNETOELECTRIC MAGNETIC FIELD SENSOR," the entire contents of which is incorporated herein by reference.

BACKGROUND OF THE INVENTION

Field of the Invention

The present invention relates to magnetic sensors, and more particularly to a high-sensitivity and ultra-low power consumption magnetic sensor comprising a magnetoelectric composite.

Description of the Prior Art

Magnetic field sensing provides critical information about battlespace threats. A wide variety of threats in the naval environment including ships, submarines, unmanned underwater vehicles (UUVs), and submerged or buried mines typically have magnetic signatures that can be identified at distance. UUVs employ electric motors that emit time-varying magnetic fields that can be expected to show unique and detectable signatures deriving from the currents and rotating magnetic assemblies of the motor. Sensitive and accurate determination of magnetic field strength combined with minimal power consumption would enable the targeting of autonomous undersea vehicles (AUVs) and other UUVs and extend mission duration/range by providing a system requiring minimal battery recharging.

There are several other technologies for magnetic field sensing, each of which is optimized for a particular magnetic field sensing range and has a number of disadvantages. Other than SQUID magnetometers, which require cryogenic temperatures for operation, sensors that operate at room temperature have a low maximum sensitivity on the order of several pT/√Hz. Additionally, the current state of the art for sensors operating in a similar range as said invention all require operational power of several mW or greater to drive a current (i.e. fluxgate, giant magnetoresistance or giant magnetoimpedance sensors). Magnetoelectric sensors that use some of the same basic principles as said invention are also very large in scale (Wang et al., *Adv. Mater.* 2011, 23, 4111), or utilize ferromagnetic resonance for detection (which is also a very high power method) (Nan et al., *Sci. Rep.* 2013, 3, 1985).

Despite advancements in Navy-specific technical research areas with relevance to magnetic sensors, present generation magnetic field sensors do not exhibit desired levels of sensitivity, $<10^{-10}$ Tesla/Hz$^{1/2}$, and power dissipation, $<10$ mW, in addition to low to zero drift due to local geomagnetic field variations.

In response to this challenge new types of materials (i.e. magnetoelectric (ME) composites) were developed and demonstrated to be very suitable for novel ME magnetic sensors. Currently these macro-ME laminates (ME composites) are most promising materials for breakthrough improvements.

ME materials couple the magnetic and electric properties to make a new type of sensor material that is sensitive to a wide range of applied magnetic field ($10^{-13}$ to $10^{-1}$ T) and exhibit an optimal frequency range of $10^{-3}$ to $10^2$ Hz working in a passive mode (low power consumption). Laminated ME composite structures (typically containing intimately bonded ferroelectric (FE) and ferromagnetic phases (FM) phases) have higher efficiency than single-phase structures, and their maximum ME efficiency occurs at structural resonance. The ME sensors are superior to other existing technologies, with extraordinarily low power dissipation (~0.1 mW), compared with ~10-100 mW for optically-pumped or fluxgate sensors. ME laminate sensors are lightweight and are suitable for miniaturization. Further improvement in signal to noise ratio and power consumption is expected with miniaturization of ME structures.

The use of thin films and reduced dimensionality with silicon based fabrication enables on-chip integration with traditional microfabrication techniques. The use of a piezoelectric drive and self-generated output signal allow for extremely low power operation compared to the current state of the art magnetic sensing technology.

The magnetoelectric magnetic sensors exploit newly demonstrated artificially engineered multiferroic (ferromagnetic+ferroelectric) structures that convert magnetic field strength directly to an electric voltage with high sensitivity (1 pT/√Hz at low frequency) and with near-zero power dissipation.

BRIEF SUMMARY OF THE INVENTION

The present invention provides a magnetoelectric (ME) composite comprising magnetostrictive and piezoelectric layers as the key components of a high-sensitivity and ultra-low power consumption magnetic sensor. It exploits the magnetically driven resonance shift of a free-standing magnetoelectric micro-beam resonator.

There are several advantages with the present invention. Integrated ME MEMS-scale magnetic sensor with sensitivity in 100 pT/Hz$^{1/2}$ range is comparable to the state in the art of magnetic sensor technology (Fluxgate etc.). Exploitation of thin film deposition techniques enhances the strain coupling between the two layers in ME sensor to achieve higher sensitivity than larger ME devices. Higher sensitivity is achieved by utilizing the doubly clamped geometry of the ME resonator as opposed to a single side clamped cantilever allowing broader range tuning. High efficiency and very low power consumption two orders of magnitude lower than in the state of the art magnetic sensor technology.

These and other features and advantages of the invention, as well as the invention itself, will become better understood by reference to the following detailed description, appended claims, and accompanying drawings.

DETAILED DESCRIPTION OF THE INVENTION

The present invention provides a passive, integrated MEMS based ME magnetic resonator as a magnetic sensor.

Enhanced ME sensor performance is achieved through the use of a structural resonance MEMS approach combined with low-power modulation (mechanical or electric) techniques using the non-linear regime of the sensor to reduce the influence of background magnetic and vibrational noise. Resonant operation also allows for signal processing at frequencies above the 1/f crossover for additional noise reduction (allowing for detection of DC and low-frequency near −DC magnetic fields). Noise reduction strategies make use of resonant frequency and low-cost wafer-scale batch fabrication of micro-nanoscale devices combined with ensemble averaging.

Figure 1A:
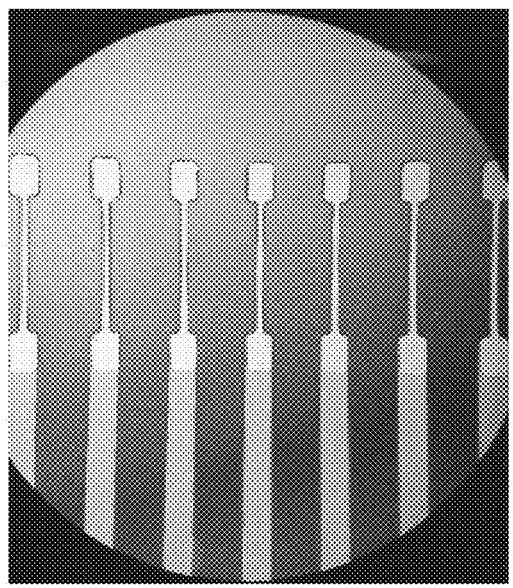
FIG. 1A is a microscope image of patterned microbeam heterostructures before substrate release.
Figure 1B:
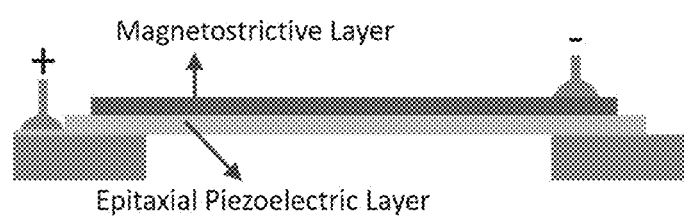
FIG. 1B is a schematic showing active layers and electrical contacts in a microbeam sensor.
Figure 2:
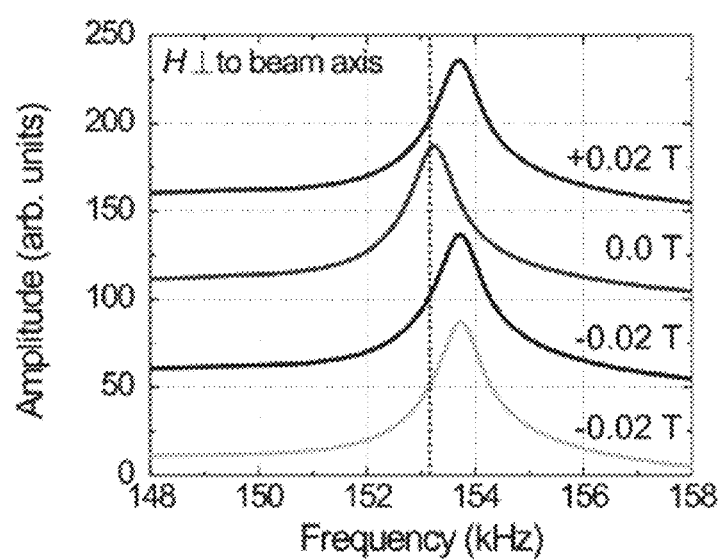
FIG. 2 shows the frequency shift of a magnetostrictive microbeam resonator when placed in a magnetic field (from Kiser et al., Applied Physics Letters, 104 (7) 072408. (2014)).

This invention realizes the first on-chip micro-resonator magnetic sensor with micron and sub-micron dimensionality (FIGS. 1A and 1B). The micro-beam is a bilayer thin film heterostructure of a magnetostrictive layer (Fe, Co, Ni, FeCo, FeCoV, FeGa . . . ) strain couple to a piezoelectric layer (AlN, PMN-PT, BTO . . . ). The magnetostrictive layer changes length under an applied magnetic field which alters the resonance frequency of the device. The heterostructure that makes up the micro-beam consists of an active magnetostrictive layer, which is strain coupled to a sensing piezoelectric layer, both grown atop a thin lattice matched metal seed layer (enabling high quality crystalline epitaxy and a conducting rear electrode). During operation the structure is excited to resonance using a low power piezoelectric crystal (PZT, PMN-PT . . . ) or directly by the AlN piezoelectric layer.

When exposed to a magnetic field the active magnetostrictive layer responds causing a considerable resonance shift as a function of a magnetic field intensity. This approach has previously been demonstrated in clamped-clamped ME bimorphs with Metglas and FeNi (Finkel et al., Appl. Phys. Lett. 98, 092905 (2011)) as well as in ME cantilevers, where the shift in frequency f is related to the delta-E effect (Gojdka et al., Appl. Phys. Lett. 99, 223502 (2011)).

Double-clamped stress-reconfigurable ME resonators can sense near DC magnetic field by determining the magnetic field induced shift in the resonant frequency resulting from a change in stress owing to magnetostriction (Kiser et al., Applied Physics Letters, 104 (7) 072408. (2014) and Staruch et al., Applied Physics Letters, 107 (3) 032909. (2015)).

The theoretical limit of detection of the proposed stress-reconfigurable sensor can be much improved compared to a one end fixed cantilever design (which has been developed but at much larger scales (Jahns et al., US Patent Application 20130289913)) due to higher Q (lower losses) and larger sensitivity proportional to frequency shift (df/dH) and reduced equivalent magnetic noise due to operation at higher resonance frequency and better resonant ME coupling and at the induced voltage. This resonance is sensed by the piezoelectric under-layer, which converts the planar strain to a voltage signal.

By sending the output of the piezoelectric layer to external circuitry, such as amplitude modulation or a phase locked loop, very low frequency magnetic fields can be detected at frequencies much less than the resonant frequency of the device.

The heterostructure is patterned into a microbeam using a series of patterning steps coupling with thin film deposition, ion milling and wet etching. The beams are then released by removing the silicon substrate using a high temperature KOH etch.

The invention also includes fabrication methods necessary to overcome extra-high internal materials stresses under sub-micron geometries which cause device self-destruction. To prevent such stresses from breaking the micro-beam, a fabrication procedure was developed using a 16 step process. Notable method inventions include epitaxial film growth optimization, a KOH patterned back etch using SiN as an etch stop, suspended reactive ion etching to avoid device contact and vertical processing baths to prevent hydraulic bending and stiction.

In one embodiment, a fabrication process is based upon building highly stressed multi-layered films on a removable silicon nitride scaffold, the silicon nitride can be partially or completely removed to form free standing double clamped cantilevers. Access to the silicon nitride is gained by back side etching completely through the silicon host wafer by KOH etching which has high selectivity between silicon and silicon nitride. A dry RIE such as a $CF_4$ plasma, or other usable RIE technique is used to remove the silicon nitride scaffold from the back side. The fabrication process also includes initiation layers of the magnetostrictive film and the piezoelectric film utilizing a metallic buffer layer to establish an initial crystalline structure or adhesion layer conducive to achieving good magnetostrictive and piezoelectric quality thin films. The fabrication process includes the steps described below.

Figure 3:
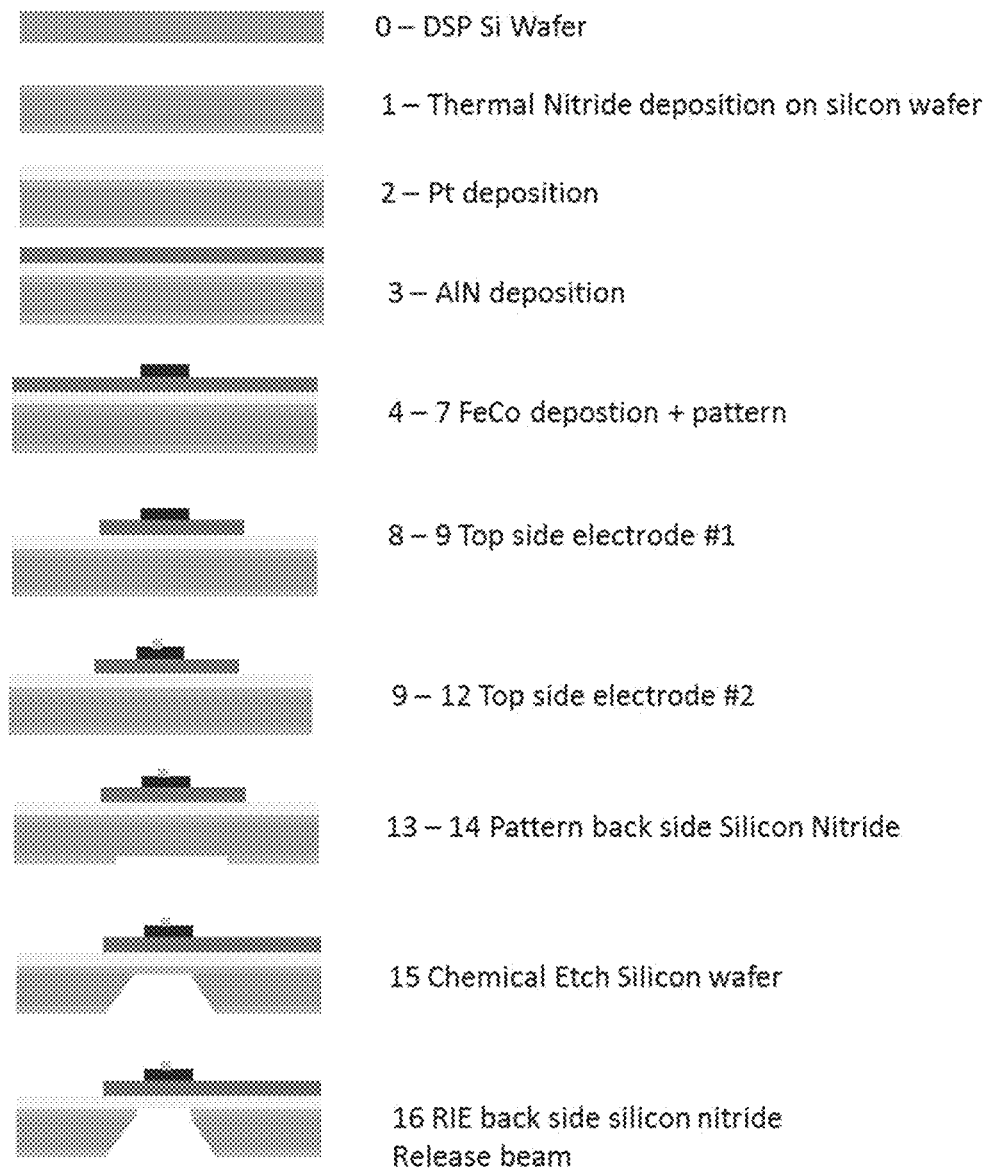
FIG. 3 is a schematic of the silicon nitride scaffold fabrication process.

Fabrication Process utilizing Silicon Nitride Scaffold may include a number or all of the following steps (FIG. 3):

1. Deposit low-stress thermal silicon nitride (0-100 MPa tensile stress) on both sides of uniform double side polish Si wafers. The low-stress thermal silicon nitride can be low-stress low pressure chemical vapor deposition (LPCVD) silicon nitride, low-stress chemical vapor deposition (CVD) silicon nitride, low-stress plasma enhanced chemical vapor deposition (PECVD) silicon nitride, or low-stress atomic layer deposition (ALD) silicon nitride.
2. Deposit a contact layer serving as a seed layer (e.g., Pt, Hf, Ta, or any combination thereof) on top side of wafer (serves as an initiation layer for the piezoelectric film and as a back side electrode).
3. Deposit/Sputter AlN or other piezoelectric layer at high temperature (450° C. or higher, preferably between 450 and 550° C.).
4. Pattern photoresist/lift-off layer to define beam geometry.
5. Sputter metallic buffer layer for initiation/adhesion layer.
6. Sputter FeCo or other magnetostrictive film optimized for magnetostrictive property and stress. This process may be completed at elevated temperatures to perform a post-deposition anneal without breaking vacuum.
7. Lift off magnetostrictive film utilizing wet chemistry.
8. Photoresist process for piezoelectric layer etch to access under lying contact layer (Pt in this case).
9. Chemical Etch AlN or other piezo-layer to define first electrode.
10. Photoresist process for top side second electrode.
11. Electrode Metallization (thermal, ebeam or sputtering).
12. Chemical lift off process for first electrode definition.
13. Perform photoresist patterning of expanded openings back side aligned to the multi-layer beams.
14. RIE etch openings in the back side silicon nitride exposing Si windows.
15. Form a smaller opening at the front side of the wafer, centered under the beams. This can be done with a KOH etch on the back side—etch follows crystalline angles. Alternatively, windows can be opened from the top with a $CF_4$ plasma.

16. Back side RIE of the silicon nitride scaffold to release the multi-layer beams.

A second Fabrication process utilizes top side release of the beam by opening windows in the underlying Pt layer exposing the silicon and isotropically etching the silicon utilizing $XeF_2$ sufficient to etch completely under the multi-layer film beams.

This ME integrated resonant sensor devices with on-chip silicon-based electronics to provide signal processing and communications functions in a compact module of micron-scale as integrated ME sensor elements with low power consumption and integrated tuning and readout mechanisms. Specialized low noise electronics can be developed for demonstrating equivalent magnetic noise reduction at resonance utilizing modulation (mechanical and/or magnetic) techniques.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method for making an on-chip micro-resonator magnetic sensor, comprising:
    depositing a low-stress thermal nitride on a top side and a bottom side of a wafer;
    depositing a bottom contact serving as a seed layer for a piezoelectric on the low-stress thermal nitride on the top side of the wafer;
    depositing a piezoelectric layer on the bottom contact serving as a seed layer;
    patterning a first photoresist or lift-off layer to define a geometry for a beam on the piezoelectric layer;
    applying a metallic buffer layer to the piezoelectric layer and the patterned photoresist or lift-off layer;
    applying a magnetostrictive layer to the piezoelectric layer and the patterned photoresist or lift-off layer;
    removing the portion of the magnetostrictive layer from the patterned photoresist or lift-off layer;
    patterning a second photoresist layer on the piezoelectric layer for a first electrode;
    etching the piezoelectric layer to define the first electrode;
    patterning a third photoresist layer on the magnetostrictive layer for a second electrode;
    metallizing the first and second electrodes;
    performing a chemical lift off process to define the first electrode;
    patterning a fourth photoresist layer of expanded openings on the low-stress thermal nitride on the bottom side of the wafer;
    etching openings in the low-stress thermal nitride on the bottom side of the wafer to form windows to the wafer;
    forming a smaller opening at the top side of the wafer; and
    performing a bottom side RIE etch on the low-stress thermal nitride to release a multi-layer beam;
    resulting in a magnetoelectric micro-beam resonator that generates a magnetically driven resonance shift.

2. The method of claim 1, wherein the bottom contact serving as a seed layer comprises Pt, Hf, Ta, or any combination thereof.

3. The method of claim 1, wherein the low-stress thermal nitride comprises low-stress LPCVD silicon nitride, low-stress CVD silicon nitride, low-stress PECVD silicon nitride, or low-stress ALD silicon nitride.

4. The method of claim 1, wherein the low-stress thermal nitride has a tensile stress in the range of 0-100 MPa.

5. The method of claim 1, wherein the low-stress thermal nitride comprises silicon nitride.

6. The method of claim 5, wherein the forming a smaller opening at the top side of the wafer comprises opening windows in the silicon nitride by $CF_4$ plasma followed by isotropically etching the silicon using $XeF_2$.

7. The method of claim 1, wherein the piezoelectric layer comprises AlN, PMN-PT, BTO, or any combination thereof.

8. The method of claim 1, wherein the magnetostrictive layer comprises, Fe, Co, Ni, FeCo, FeCoV, FeGa, or any combination thereof.

9. The method of claim 1, wherein the magnetic sensor has a sensitivity $10^{-10}$ Tesla/$Hz^{1/2}$ or less.

10. The method of claim 1, wherein the magnetic sensor has a power dissipation of less than 10 mW.

11. The method of claim 1, wherein the magnetic sensor has a power dissipation of about 0.1 mW.

12. The method of claim 1, wherein the forming a smaller opening at the top side of the wafer comprises performing a KOH etch on the bottom side of the wafer following crystalline angles, opening windows from the top side with a $CF_4$ plasma, or a combination thereof.

13. The method of claim 1, wherein the piezoelectric layer is deposited at a temperature between 450 and 550° C.

* * * * *